United States Patent
Kim

(10) Patent No.: US 12,408,237 B2
(45) Date of Patent: Sep. 2, 2025

(54) CIRCUIT FOR SENSING AND CONTROLLING HEATER VOLTAGE IN AEROSOL GENERATOR

(71) Applicant: EM-TECH Co., Ltd., Gyeongsangnam-do (KR)

(72) Inventor: Young-je Kim, Seoul (KR)

(73) Assignee: EM-TECH Co., Ltd., Gyeongsangnam-do (KR)

( * ) Notice: Subject to any disclaimer, the term of this patent is extended or adjusted under 35 U.S.C. 154(b) by 771 days.

(21) Appl. No.: 17/777,161

(22) PCT Filed: Nov. 18, 2020

(86) PCT No.: PCT/KR2020/016226
§ 371 (c)(1),
(2) Date: May 16, 2022

(87) PCT Pub. No.: WO2021/101228
PCT Pub. Date: May 27, 2021

(65) Prior Publication Data
US 2022/0400535 A1    Dec. 15, 2022

(30) Foreign Application Priority Data
Nov. 18, 2019   (KR) .................. 10-2019-0147655

(51) Int. Cl.
*H05B 1/02*     (2006.01)
*A24F 40/51*    (2020.01)
(Continued)

(52) U.S. Cl.
CPC ........... *H05B 1/0244* (2013.01); *A24F 40/51* (2020.01); *A24F 40/57* (2020.01);
(Continued)

(58) Field of Classification Search
None
See application file for complete search history.

(56) References Cited

U.S. PATENT DOCUMENTS

| 2012/0048266 A1 | 3/2012 | Alelov |
| 2013/0042865 A1 | 2/2013 | Monsees et al. |

(Continued)

FOREIGN PATENT DOCUMENTS

| KR | 20160131035 A | 11/2016 |
| KR | 20190035486 A | 4/2019 |

(Continued)

*Primary Examiner* — John J Norton
(74) *Attorney, Agent, or Firm* — Murphy, Bilak & Homiller, PLLC

(57) ABSTRACT

The present invention relates to an aerosol generator that vaporizes a liquid type inhalation material, and more particularly, to a circuit capable of sensing and controlling a heater voltage, without being affected by power of a battery, in an aerosol generator using a liquid cartridge. According to the present invention, there is provided a circuit for sensing and controlling a heater voltage in an aerosol generator, the circuit including: a battery that supplies power; a microcontroller; a first FET connected to the battery and turned on/off according to a sensing control signal output from the microcontroller; a sensing resistor connected to the first FET; a second FET connected to the battery and turned on/off according to a heater control signal output from the microcontroller; and a heater resistor connected to the second FET and also connected to one end of the sensing resistor, wherein the upstream end of the sensing resistor is connected to the microcontroller, and the downstream end of the sensing resistor has one side connected to the microcontroller and the other side connected to the second FET.

4 Claims, 4 Drawing Sheets

(51) Int. Cl.
 *A24F 40/57* (2020.01)
 *G01R 19/165* (2006.01)
 *A24F 40/10* (2020.01)

(52) U.S. Cl.
 CPC ..... *G01R 19/16576* (2013.01); *H05B 1/0227* (2013.01); *A24F 40/10* (2020.01); *H05B 2203/035* (2013.01)

(56) References Cited

U.S. PATENT DOCUMENTS

2015/0208729 A1*  7/2015  Monsees .............. H05B 1/0244
                                                    131/329
2018/0140014 A1*  5/2018  Yu ........................... A24F 40/46
2020/0237010 A1*  7/2020  Yamada ............... H05B 1/0244

FOREIGN PATENT DOCUMENTS

| WO | 2016135959 A1 | 9/2016 |
| WO | 2019068821 A1 | 4/2019 |
| WO | 2019082248 A1 | 5/2019 |
| WO | 2019082280 A1 | 5/2019 |
| WO | 2019146063 A1 | 8/2019 |

* cited by examiner

CIRCUIT FOR SENSING AND CONTROLLING HEATER VOLTAGE IN AEROSOL GENERATOR

TECHNICAL FIELD

The present invention relates to an aerosol generator that vaporizes a liquid type inhalation material, and more particularly, to a circuit capable of sensing and controlling a heater voltage, without being affected by power of a battery, in an aerosol generator using a liquid cartridge.

BACKGROUND

Aerosols are small liquid or solid particles suspended in the atmosphere that typically have a size of 0.001 to 1.0 µm. In particular, people may inhale aerosols derived from various types of liquids for various purposes. For example, a nebulizer is known for treating diseases.

FIG. 1 is a sectional view showing one embodiment of an aerosol generator to which the present invention is applicable. Referring to FIG. 1, when the user uses the aerosol generator 100, a heater 31 of a liquid cartridge 30 is heated, a liquid is vaporized and introduced into a hole 20 with an aerosol-forming substrate 10 therein through a passage, and a pipe heater 40 is heated that is provided in the hole 20 to heat the aerosol-forming substrate 10 around it, such that the user can inhale both an inhalation material vaporized from the liquid in the liquid cartridge 30 and an inhalation material vaporized from the aerosol-forming substrate 10 in the hole 20. However, the aerosol generator 100 that heats the heater 31 to vaporize the liquid as described above has a disadvantage in that the user may not feel a satisfactory inhalation sensation and may feel discomfort caused by a burnt taste, in the case of the heater 31 being overheated, because a voltage applied to the heater 31 may vary depending on the performance and condition of a battery 50 and the using environment of the aerosol generator 100.

SUMMARY

An object of the present invention is to provide a circuit for sensing and controlling a heater voltage in an aerosol generator using a liquid cartridge that can sense and control the heater voltage, without being affected by power of a battery, to prevent discomfort caused by a burnt taste.

According to an aspect of the present invention for achieving the above object, there is provided a circuit for sensing and controlling a heater voltage in an aerosol generator, the circuit comprising: a battery that supplies power; a microcontroller; a first FET connected to the battery and turned on/off according to a sensing control signal output from the microcontroller; a sensing resistor connected to the first FET; a second FET connected to the battery and turned on/off according to a heater control signal output from the microcontroller; and a heater resistor connected to the second FET and also connected to one end of the sensing resistor, wherein the upstream end of the sensing resistor is connected to the microcontroller, and the downstream end of the sensing resistor has one side connected to the microcontroller and the other side connected to the second FET.

According to the present invention, it is possible to provide the circuit capable of sensing and controlling the heater voltage, without being affected by power of the battery, in the aerosol generator using the liquid cartridge.

According to the present invention, it is possible to provide the aerosol generator that can sense and control the heater voltage, without being affected by power of the battery, to prevent a burnt taste.

DETAILED DESCRIPTION

A circuit for sensing and controlling a heater voltage in an aerosol generator according to one embodiment of the present invention comprises: a battery that supplies power; a microcontroller; a first FET connected to the battery and turned on/off according to a sensing control signal output from the microcontroller; a sensing resistor connected to the first FET; a second FET connected to the battery and turned on/off according to a heater control signal output from the microcontroller; and a heater resistor connected to the second FET and also connected to one end of the sensing resistor.

In some embodiments, the upstream end of the sensing resistor may be connected to the microcontroller, and the downstream end of the sensing resistor may have one side connected to the microcontroller and the other side connected to the second FET.

In some embodiments, the microcontroller may output the sensing control signal to the first FET according to a predetermined period and determine the heater voltage by dividing a voltage at the upstream end of the sensing resistor by a voltage at the downstream end of the sensing resistor.

In some embodiments, when determining that the heater voltage is higher or lower than a preset value, the microcontroller may adjust the duty of the heater control signal and output the heater control signal to the second FET.

Hereinafter, a preferred embodiment of a circuit for sensing and controlling a heater voltage in an aerosol generator according to the present invention will be described in detail with reference to the accompanying drawings.

Figure 1:
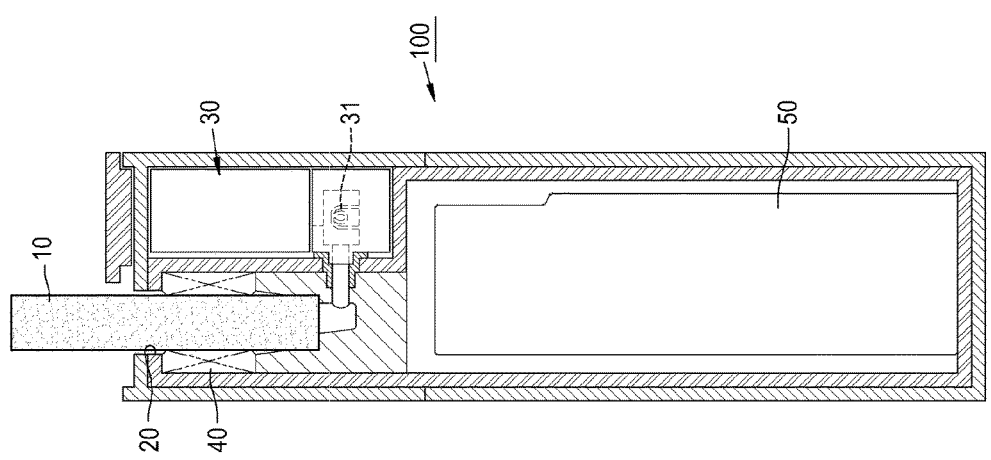
FIG. 1 is a sectional view showing one embodiment of an aerosol generator to which the present invention is applicable.
Figure 2:
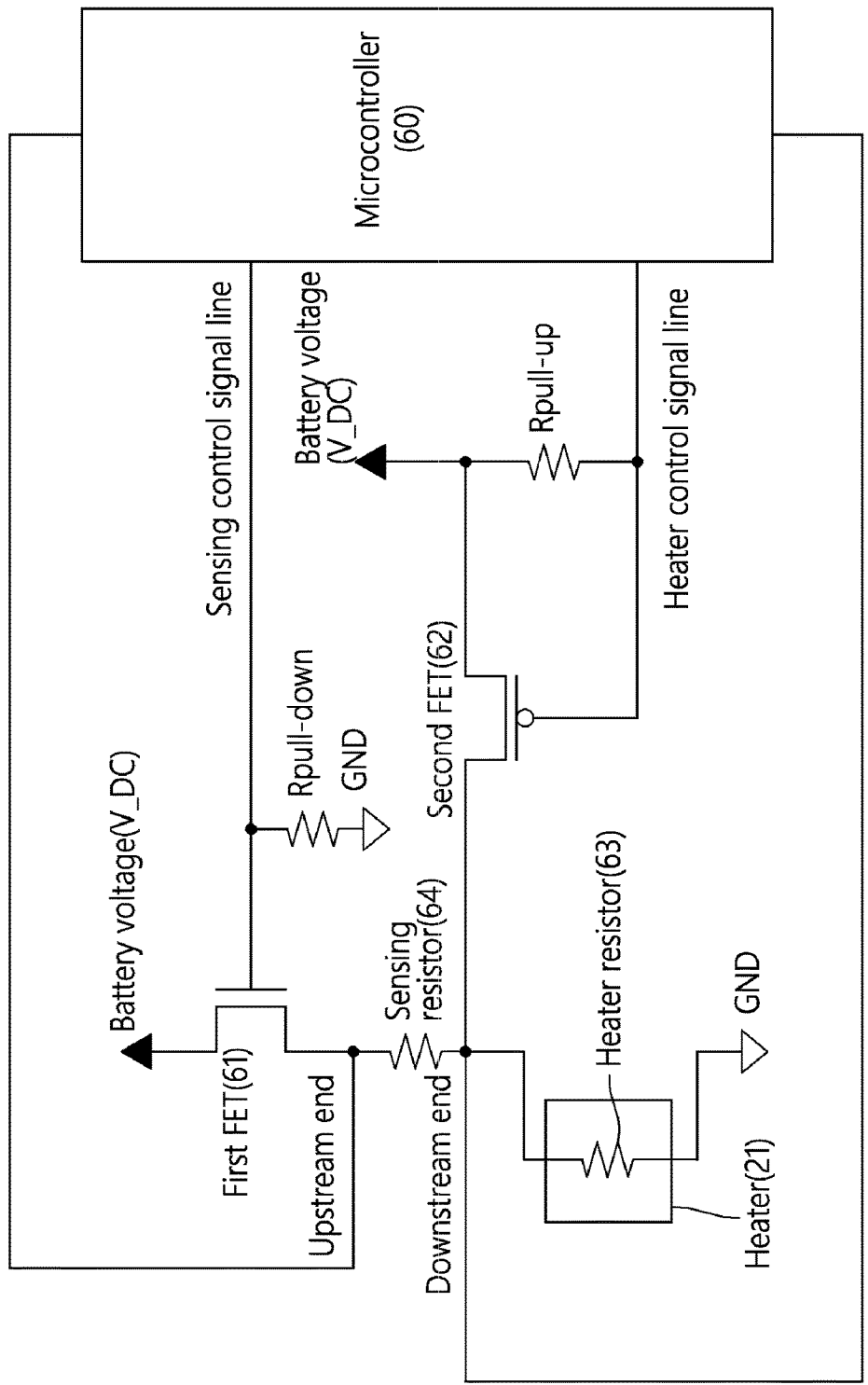
FIG. 2 is a circuit diagram showing a circuit for sensing and controlling a heater voltage in the aerosol generator according to one embodiment of the present invention.
Figure 3:
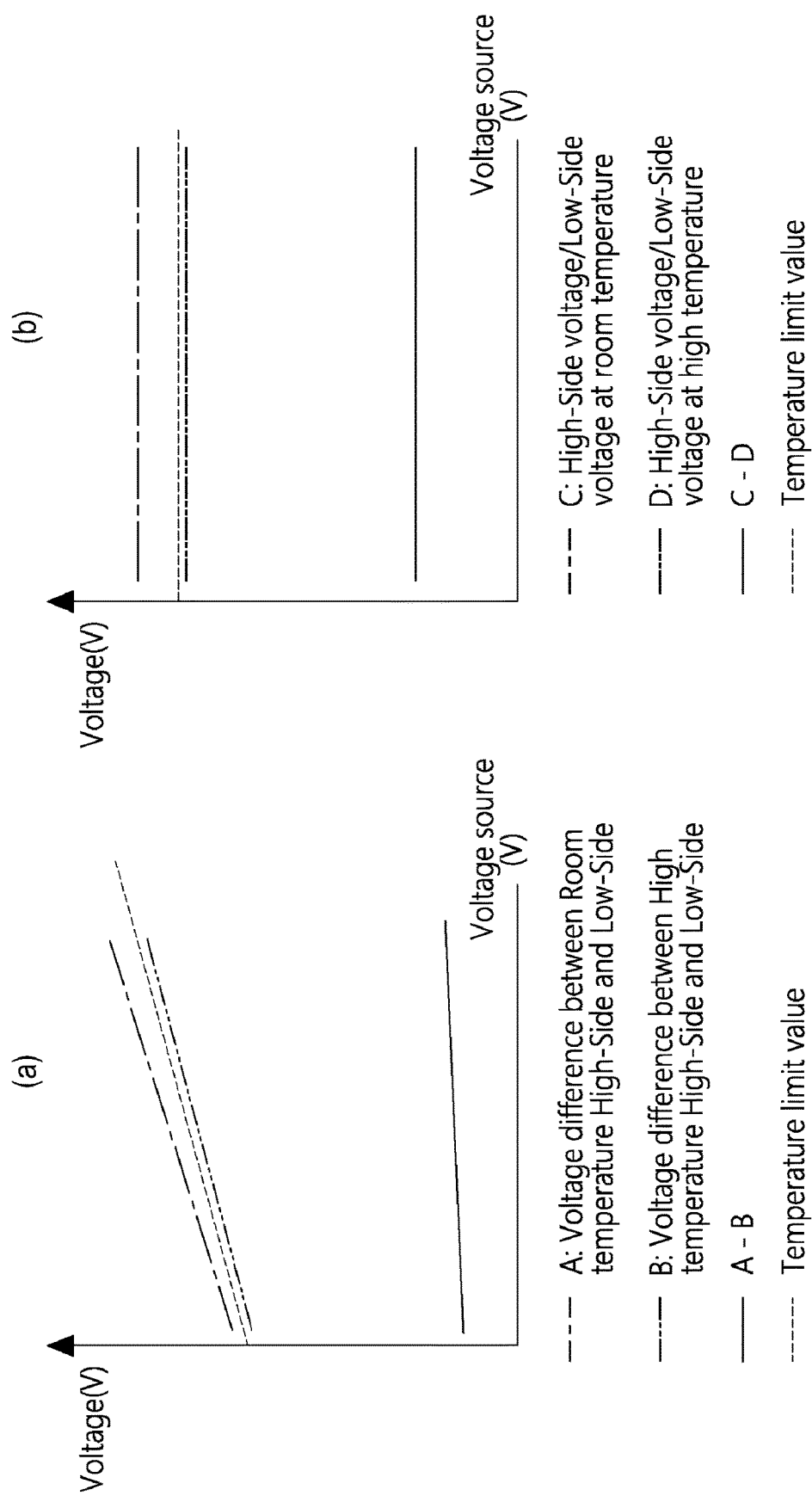
FIG. 3 are graphs for explaining sensing of the heater voltage according to the present invention by comparison.

FIG. 1 is a sectional view showing one embodiment of an aerosol generator to which the present invention is applicable. FIG. 2 is a circuit diagram showing a circuit for sensing and controlling a heater voltage in the aerosol generator according to one embodiment of the present invention. FIG. 3 are graphs for explaining sensing of the heater voltage according to the present invention by comparison. Referring to FIGS. 1 to 3, the circuit for sensing and controlling the heater voltage in the aerosol generator according to the present invention includes a battery 50 that supplies power, a microcontroller 60, a first FET 61 connected to the battery 50 and turned on/off according to a sensing control signal output from the microcontroller 60, a sensing resistor 64 connected to the first FET 61, a second FET 62 connected to the battery 50 and turned on/off according to a heater control signal output from the microcontroller 60, and a heater resistor 63 connected to the second FET 62 and also connected to one end of the sensing resistor 64. In addition, the upstream end of the sensing resistor 64 is connected to the microcontroller 60, and the downstream end of the sensing resistor 64 has one side connected to the microcontroller 60 and the other side connected to the second FET 62. Here, the first FET 61 has a gate terminal connected to the microcontroller 60 through a sensing control signal line, a drain terminal connected to the battery 50, and a source terminal connected to the upstream end of the sensing resistor 64. Further, the second FET 62 has a gate terminal connected to the microcontroller 60 through a heater control signal line, a drain terminal connected to the battery 50, and a source terminal connected to the downstream end of the sensing resistor 64.

When the user fits the liquid cartridge 30 into the aerosol generator 100 and presses a button (not shown) on the aerosol generator 100, the microcontroller 60 outputs a PWM signal, which is the heater control signal, to the second FET 62, the second FET 62 is turned on/off according to the PWM signal to supply power from the battery 50 to the heater 31, and the heater resistor 63 provided in the heater 31 heats and vaporizes the liquid contained in the liquid cartridge 30.

During this heating operation, the microcontroller 60 outputs the sensing control signal to the first FET 61 according to a predetermined period and checks a voltage at the upstream end and the downstream end of the sensing resistor 64. The voltage at the upstream end of the sensing resistor 64 can be represented by the following formula 1:

$$\frac{V\_DC * (Rs + Rh)}{Rds(on) + Rs + Rh}$$

wherein V_DC denotes a value of the battery voltage, Rs denotes a value of the sensing resistor 64, and Rh denotes a value of the heater resistor 63. Rds(on) denotes a drain-source resistance value during the operation of the first FET 61. In addition, the voltage at the downstream end of the sensing resistor 64 can be represented by the following formula 2:

$$\frac{V\_DC * Rh}{Rds(on) + Rs + Rh}$$

wherein V_DC denotes a voltage of the battery voltage, Rs denotes a value of the sensing resistor 64, Rh denotes a value of the heater resistor 63, and Rds(on) denotes a drain-source resistance value during the operation of the first FET 61.

As can be seen from the above Formula 1, which represents the voltage at the upstream end of the sensing resistor 64, and Formula 2, which represents the voltage at the downstream end of the sensing resistor 64, the voltage at the upstream end of the sensing resistor 64 and the voltage at the downstream end of the sensing resistor 64 are affected by the battery voltage V_DC.

According to the present invention, the microcontroller 60 determines the heater voltage by the following Formula 3 derived by dividing the voltage at the upstream end of the sensing resistor 64 by the voltage at the downstream end of the sensing resistor 64:

$$\frac{Rs + Rh}{Rh}$$

wherein Rs denotes a value of the sensing resistor 64 and Rh denotes a value of the heater resistor 63.

As can be seen from the above Formula, it is thus possible to determine the heater voltage, without being affected by the variation of the battery voltage, by determining the heater voltage by Formula 3 derived by dividing the voltage at the upstream end of the sensing resistor 64 by the voltage at the downstream end of the sensing resistor 64.

Referring to graph (a) of FIG. 3, since the difference between the voltage at the upstream end High-Side of the sensing resistor 64 and the voltage at the downstream end Low-Side of the sensing resistor 64 is not large at room temperature and high temperature and is affected by the battery voltage V_DC which is a voltage source, if the microcontroller 60 determines the heater voltage simply by comparing the voltage at the upstream end High-Side of the sensing resistor 64 with the voltage at the downstream end Low-Side of the sensing resistor 64, then it cannot easily precisely sense the temperature according to the heater voltage. On the contrary, referring to graph (b) of FIG. 3, since the value obtained by dividing the voltage at the upstream end High-Side of the sensing resistor 64 by the voltage at the downstream end Low-Side of the sensing resistor 64 has a large difference at room temperature and high temperature and is not affected by the battery voltage V_DC which is a voltage source, the microcontroller 60 can easily sense the temperature according to the heater voltage by determining the heater voltage by the above Formula 3 derived by dividing the voltage at the upstream end High-Side of the sensing resistor 64 by the voltage at the downstream end Low-Side of the sensing resistor 64.

Figure 4:
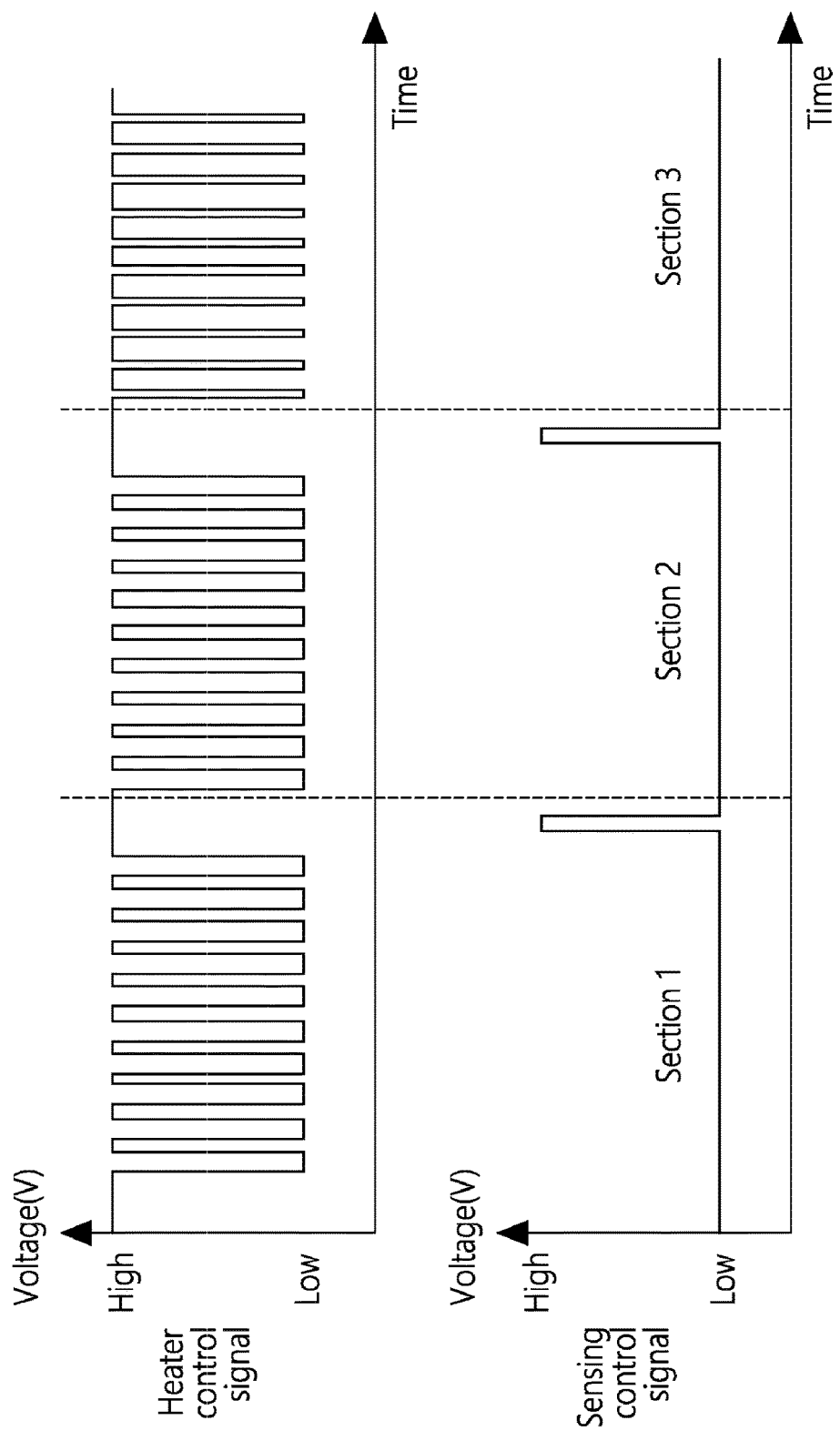
FIG. 4 is a waveform diagram for explaining sensing and controlling of the heater voltage according to one embodiment of the present invention.

FIG. 4 is a waveform diagram for explaining sensing of the heater voltage and controlling of the heater in the aerosol generator according to one embodiment of the present invention. FIG. 4 is intended to explain sensing of the heater voltage and controlling of the heater, when the second FET 62 operates in the case of the heater control signal being low and when the first FET 61 operates in the case of the sensing control signal being high. When determining that the heater voltage is higher or lower than a preset value by the above-described process, the microcontroller 60 adjusts the duty of the heater control signal and outputs the heater control signal to the second FET 62. When the waveform of the heater control signal maintains a high value for a predetermined time, it periodically has a rest period, and the sensing control signal is output for a predetermined time in the rest period. The microcontroller 60 determines the heater voltage according to the value of the above Formula 3 while the sensing control signal is being output. The microcontroller 60 can determine the temperature according to the heater voltage, adjust the duty of the heater control signal, when the temperature is higher or lower than the preset temperature, and output the heater control signal. FIG. 4 shows that the duty of the heater control signal has been adjusted in Section 3. As the microcontroller 60 adjusts the duty of the heater control signal and outputs the heater control signal to the second FET 62, it is possible to adjust power from the battery 50 and supply it to the heater 31 according to the on/off operation of the second FET 62 caused by the duty of the heater control signal, and consequently, to control the heater voltage and thus the temperature of the heater 31.

The present invention is not limited to the preferred embodiment described above. Therefore, it will be understood by one of ordinary skill in the art that various modifications and changes can be made thereto without departing from the spirit and scope of the invention defined by the appended claims.

According to the present invention, it is possible to provide the circuit capable of sensing and controlling the heater voltage, without being affected by power of the battery, in the aerosol generator using the liquid cartridge, and to provide the aerosol generator that can sense and control the heater voltage, without being affected by power of the battery, to prevent a burnt taste.

What is claimed is:

1. A circuit for sensing and controlling a heater voltage in an aerosol generator, the circuit comprising:

a battery configured to supply power;

a microcontroller;

a first FET connected to the battery and configured to turn on/off according to a sensing control signal output from the microcontroller;

a sensing resistor connected to the first FET;

a second FET connected to the battery and configured to turn on/off according to a heater control signal output from the microcontroller; and a heater resistor connected to the second FET and to one end of the sensing resistor, wherein an upstream end of the sensing resistor is connected to the microcontroller, and a downstream end of the sensing resistor has one side connected to the microcontroller and another side connected to the second FET.

2. The circuit of claim 1, wherein the microcontroller is configured to output the sensing control signal to the first FET according to a predetermined period and determine the heater voltage by dividing a voltage at the upstream end of the sensing resistor by a voltage at the downstream end of the sensing resistor.

3. The circuit of claim 2, wherein when determining whether the heater voltage is higher or lower than a preset value, the microcontroller is configured to adjust a duty of the heater control signal and output the heater control signal to the second FET.

4. The circuit of claim 3, wherein a waveform of the heater control signal periodically has a rest period, and wherein the microcontroller is configured to determine the heater voltage while the sensing control signal is being output in the rest period.

* * * * *